United States Patent [19]

Spence

[11] 3,990,070

[45] Nov. 2, 1976

[54] STROBING SCHEME AND KEYBOARD SENSING CIRCUIT FOR A ONE CHIP CALCULATOR

[75] Inventor: John R. Spence, Villa Park, Calif.

[73] Assignee: Rockwell International Corporation, El Segundo, Calif.

[22] Filed: June 23, 1975

[21] Appl. No.: 589,655

[52] U.S. Cl. ............................... 340/337; 307/205; 340/324 M; 340/365 S
[51] Int. Cl.² ........................................ G09B 13/00
[58] Field of Search ............ 340/337, 324 R, 324 M, 340/365 R, 365 S, 173 CA, 166 EL, 336; 307/205, 238, 251

[56] References Cited
UNITED STATES PATENTS

| | | | |
|---|---|---|---|
| 3,761,620 | 9/1973 | Graven | 178/18 |
| 3,781,852 | 12/1973 | White et al. | 340/336 |
| 3,909,631 | 9/1975 | Kitagawa | 307/205 |
| 3,925,686 | 12/1975 | Nomiya | 307/205 |
| 3,935,474 | 1/1976 | Komarek | 307/205 |

Primary Examiner—Marshall M. Curtis
Attorney, Agent, or Firm—H. Fredrick Hamann; G. Donald Weber, Jr.; Morland Charles Fischer

[57] ABSTRACT

Circuitry having a unique strobing scheme to effectively drive both a light-emitting diode display and an associated keyboard directly from a single semiconductor chip. The circuitry accurately senses which of the keyboard keys is in a depressed condition in order that a suitable representation thereof may be displayed at an appropriate time.

11 Claims, 1 Drawing Figure

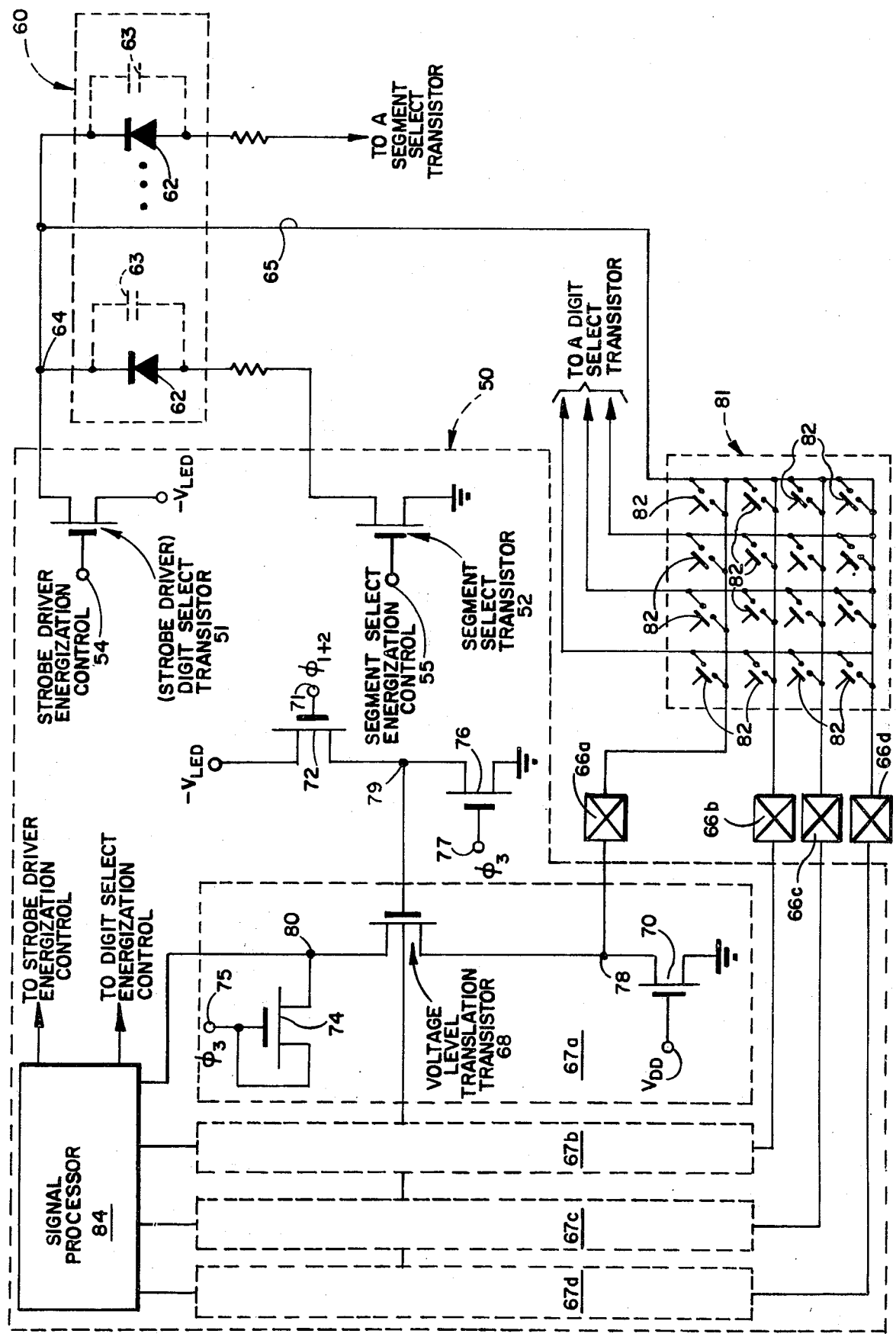

STROBING SCHEME AND KEYBOARD SENSING CIRCUIT FOR A ONE CHIP CALCULATOR

BACKGROUND OF THE INVENTION

1. Field of the Invention

This invention relates generally to one-chip calculators, such as those of the hand-held type, and means for effectively driving a keyboard and an associated display directly from the chip.

2. Brief Description of Prior Art

One conventional circuit for driving an LED display and an associated keyboard array requires that a plurality of external buffer transistors and current limiting resistors be utilized to accommodate the relatively high peak currents which are otherwise generated to illuminate the light-emitting diodes of the display. For example, the peak currents which may pass through both the strobe driver transistor and a segment select transistor may be between 30–40 ma. and 4–5 ma., respectively. Because of the relatively incompatible low voltage requirements of the light-emitting diodes of the display in comparison with the available voltage at the output of the strobe drivers of the conventional circuitry, it is difficult to employ the same strobe drivers for interfacing with said driving both the display and associated keyboard. As a consequence, this conventional circuit has the disadvantage of requiring additional transistors which results in relatively high space consumption and corresponding increased costs per circuit. Relatively high voltage supplies are also required to maintain a bright display, because the display otherwise tends to become dimmed as an associated supply voltage connected to one of the buffer transistors (such as a battery voltage) becomes subsequently dimmed with the continued passage of time.

In another conventional circuit, the more light-emitting diodes being energized, the greater is the loading applied to the keyboard input. Hence, reference signal levels which are indicative of the opened and closed switch positions of the keyboard keys become relatively indistinguishable from one another. As a result of the increased loading, the presence of additional keyboard driver transistors are frequently required in order to obtain an accurate indication of a designated key means switch position. Consequently, the additional number of pad connections resulting from the added keyboard driver transistors further undesirably increases the size and cost of the circuit.

SUMMARY OF THE INVENTION

Briefly, and in general terms, circuitry is disclosed having a strobing scheme to effectively drive both a light-emitting diode readout display and an associated keyboard directly from a single semiconductor chip. Such a light-emitting diode display may be found in calculators of the hand-held type.

The circuitry also includes means to determine the switch position of any designated key comprising the keyboard so that, at the appropriate time, a suitable representation thereof may be displayed. The circuitry has a voltage supply for energizing the display, first and second data nodes, a source of first and second reference potentials, and at least one field effect transistor. The first data node is connected to the voltage supply to be energized thereby via a designated keyboard key means when the designated key means is in a closed or depressed switch condition. The second data node is selectively connected to the source of reference potential to receive the first reference potential and be charged thereby during a first portion of the circuit operating cycle. The gate electrode of the field effect transistor is selectively connected to the voltage supply during a second portion of the circuit operating cycle to render the transistor conductive and thereby connect the first and second data nodes together at a common electrical junction through the source-drain condition path thereof. The common junction of the first and second data nodes is selectively connected to the source of reference potential to receive the second reference potential when the designated key means is in an opened or non-depressed condition. The second data node is thereby discharged to the second reference potential. Signal processing means is connected to the second data node. The signal processing means is responsive to the potential at the second data node so as to be indicative of the opened and closed switch positions of the designated keyboard key means.

BRIEF DESCRIPTION OF THE DRAWINGS

The single FIGURE shows the circuitry of the instant invention to effectively drive both a light-emitting diode readout display and an associated keyboard directly from a single semiconductor chip and a means to sense the switch positions of any of the keyboard keys.

DESCRIPTION OF THE PREFERRED EMBODIMENT

The single FIGURE illustrates the unique and effective circuit of the instant invention to energize both a light-emitting diode (LED) display 60 and an associated keyboard 81 directly from a single semiconductor chip 50. The circuit described herein may be employed in an arithmetical calculator or the like, such as that of the hand-held type. The semiconductor (e.g., MOS) calculator chip 50 contains one or more strobe driver or digit select transistor means, such as field effect transistor (FET) 51, a plurality of segment select transistor means, such as field effect transistor (FET) 52, and a corresponding number of light-emitting diode segments which comprise a digit or the display 60. FETs 51 and 52, in the instant embodiment, are conventional p-channel FETs. However, these or other suitable types of semiconductor devices are contemplated. Generally, one strobe driver transistor 51 is utilized to generate cyclical strobe output pulses in order to energize a respective digit of the display 60. Generally, one segment select transistor 52 is utilized to selectively energize each of a plurality of respective segments which comprises a digit of the display 60. A conventional digit may be comprised of seven segments plus a decimal point. For convenience, only one of the plurality of segment select FETs 52 and the light-emitting diodes 62 which comprise one digit of the display 60 are illustrated. The light-emitting diodes 62 and display 60 may be, for example, conventional 0.5 ma. dc light-emitting diode devices. A more detailed description of a light-emitting diode display having associated strobe driver and digit select field effect transistors may be found in U.S. Pat. No. 3,925,690, issued Dec. 9, 1975.

The control or gate electrodes of strobe driver FET 51 and segment select FET 52 are selectively connected to terminals 54 and 55, respectively, of an energization control circuit (not shown). The drain electrode of strobe driver FET 51 is connected to a source of dc voltage $-V_{LED}$, which may typically be a 9 v. battery. The second electrode of strobe driver FET 51 is connected to a common junction 64 with the cathodes of light-emitting diodes 62. The source electrode of segment select FET 52 is connected to the anode of a respective light-emitting diode 62. The drain electrode of segment select FET 52 is connected to a source of reference potential, such as ground.

In operation, each strobe driver FET 51 (of a multi-digit display) is effectively used to drive both display 60 and keyboard 81 directly from chip 50. When the status (i.e., the key switch position) of any designated key means 82 which comprises keyboard 81 is to be determined, strobe driver FET 51 is first rendered conducting while the corresponding segment select FETs 52 are rendered non-conducting. Thus, no current is conducted through the display 60. This has the effect of increasing the magnitude (i.e., more negative) of the potential at common junction 64 for effective driving of the keyboard 81 during the status check of the keys 82.

Initially, the strobe drive FETs 51 and segment select FETs 52 are de-energized. The energization control circuit is selectively connected from terminal 54 to the gate electrode of a strobe driver FET 51 during a predetermined interval before the energization of a segment select FET 52. The energization control circuit is disconnected between terminal 55 and the gate electrode of segment select FET 52 to prevent FET 52 from becoming energized during the predetermined interval. At this predetermined interval, the status of any of the keyboard keys 82 is determined. By de-energizing the segment select FETs 52 during a status check of the keys 82, undesirable loading effects at the input of keyboard 81 which are common to many of the prior art circuits are eliminated. Subsequent to the interval during which the status check is performed, the energization control circuit is selectively connected from terminal 55 to the gate electrode of segment select FET 52 to energize segment select FET 52 and thereby enable the display 60 to be illuminated. One example of a transistor circuit including a plurality of strobe driver FETs having an associated memory which may comprise the energization control circuit herein described may be found in U.S. Pat. No. 3,798,616, issued Mar. 19, 1974, and assigned to the present assignee.

One of a number (e.g. four) of keyboard pads or similar connections 66a–66d is connected in series from one of a corresponding number of voltage level translation circuits 67a–67d of each of the key means 82 which comprises a row of keyboard 81. Each of the voltage level translation circuits 67a–67d are identical in structure and operation, and for this reason, only circuit 67a is illustrated and described in detail. The voltage level translation circuit 67a is comprised of a voltage level translator field effect transistor 68, a field effect transistor 74, connected in a source-follower configuration, first and second data nodes 78 and 80, respectively, and a high impedance field effect transistor 70. First data node 78 is electrically connected in series from translation circuit 67a through its associated keyboard pad 66a to a row of keyboard keys 82. The impedance of FET 70 is made approximately 20–30 times greater than that of the strobe driver FET 51, so that the voltage at the first data node 78 and at common junction 64 is made slightly more relatively positive (e.g., from −9 v. dc. to −8.5 v. dc.) when a keyboard key 82 is depressed.

The keyboard 81 is comprised of a convenient array of any suitable electrical or mechanical key means 82 (e.g., in a four by four normally opened single pole, single throw switch matrix). Each of the keys 82 comprising a column of keyboard 81 is electrically connected via a respective circuit line 65 to common junction 64 and to the source voltage $-V_{LED}$ through the source-drain conduction path of a strobe driver field effect transistor 51. Each key 82 is connected in the array so as to have a distinct coordinate location with respect to a strobe driver FET 51 and to a keyboard pad 66a–66d, as shown.

Each voltage translation circuit 67a–67d is connected to an input of a signal processor 84. The processor 84 is comprised of a data register (not shown) and a test circuit (also not shown) having a time delay means to account for a bouncing key 82. One purpose of processor 84 is to sense which particular strobe drive FET 51 is rendered conducting and which keyboard pad 66a–66d is energized during the status check of the keys 82 so as to maintain an accurate accounting of the coordinate location of a designated depressed keyboard key 82. A suitable representation of the designated key is subsequently displayed by energizing the requisite number of light-emitting diodes 62 of display 60.

In a preferred embodiment, the instant circuit may be synchronously controlled. A suitable multi-phase clock generator arrangement, such as a 4 $\phi$ system or the like, may be provided to periodically generate one of a plurality of voltage level signals, for example, $V_{DD}$ (−15 v. dc.) and ground. Other timing arrangements, however, (e.g., a 2 $\phi$ system) are also contemplated herein. Included in the circuit are field effect transistors 72 and 76. FETs 68, 70, 72, 74 and 76, in the instant embodiment, are P-channel devices. The drain electrodes of FETs 72 and 76 and the control (i.e., gate) electrode of voltage level translator FET 68 are connected together at a common junction 79. The control (i.e., gate) electrode of FET 72 is connected to a terminal 71 of the clock generator so as to receive a first voltage level input signal (e.g., −15 volts dc) during clock phases 1 and 2. The gate electrode of FET 76 is connected to a terminal 77 of the clock generator so as to receive the first voltage level input signal during clock phase 3. The source electrode of FET 74 is connected to a common junction with the drain electrode of voltage level translator FET 68 and an input of signal processor 84 at the second data node 80. The gate and drain electrodes of FET 74 are connected to a terminal 75 of the clock generator so as to receive the first voltage level input signal during clock phase 3.

During clock phases 1 and 2, the first voltage level input signal is applied from terminal 71 of the clock generator to the gate electrode of FET 72 so as to render FET 72 conducting. The source voltage $-V_{LED}$ is applied to the source electrode of FET 72 via the source-drain conduction path thereof to precharge common junction 79. Coincidently with clock phase 1, the energization control circuit is selectively connected from terminal 54 to the gate electrode of strobe driver FET 51 so as to render FET 51 conducting during the status check of keyboard keys 82. This may be accomplished by programming the signal processor data register according to conventional micro-processor techniques in order to control the energization control circuit. When a desired key 82 is depressed, common junction 64 is connected via circuit line 65 through an associated keyboard pad 66a to first data node 78. Thus, nodes 64 and 78 will form a common electrical junction.

During clock phase 3, the first voltage level input signal is removed from the gate electrode of FET 72, and a second voltage level input signal (e.g., ground) is applied thereto from the clock generator. FET 72 is thereupon rendered nonconducting. Additionally, at clock phase 3, first voltage level input signals are supplied from terminals 75 and 77 of the clock generator to the gate electrodes of FETs 74 and 76, respectively. FET 74 is thereby rendered conducting. Thus, the second data node 80 is precharged to a first reference potential by the first voltage level input signal applied from terminal 75 via the serially connected source-drain conduction path of FET 74. Simultaneously, FET 72 is rendered nonconducting and FET 76 is rendered conducting so as to discharge previously precharged common junction 79 to ground through the source-drain conduction path of FET 76. At the next succeeding clock phase 1 or 2 of the clock generator, FET 72 will again be rendered conducting so as to charge common junction 79 and, accordingly, energize the gate electrode of voltage level translator FET 68 with the source voltage $-V_{LED}$.

In a first example, if a particularly designated key 82 is depressed and its respective strobe driver FET 51 is rendered conducting, FET 68 remains nonconducting because of an insufficient gate-to-source threshold potential. When a key 82 is depressed, the voltage at common junction 64 (e.g., −8.5 v. dc.) is applied to both first data node 78 and, thus, to the source electrode of FET 68 via circuit line 65. Therefore, data nodes 78 and 80 are electrically disconnected from each other. Signal processor 84 is responsive to the first reference potential ($V_{DD} - V_t \approx -12$ v. dc.) of first data node 80 during clock phase 2 to thereby indicate that the designated key 82 is in the depressed or closed condition.

In a second example, if a particularly designated key 82 is not depressed or if the respective strobe driver FET 51 were not rendered conducting, then at the next succeeding clock phase 1 or 2, first data node 78 and the source electrode of FET 68 are connected to receive a second reference potential (e.g., ground) through the source-drain conduction path of high impedance FET 70. Voltage level translator FET 68 is rendered conducting because of a sufficient source-gate threshold voltage. With the rendering of FET 68 conducting, second data node 80 (which was previously precharged) is discharged to the second reference potential through data node 78 via the source-drain conduction path of FET 68. Hence, signal process 84 is responsive to the second reference potential of second data mode 80 at the end of clock phase 2 to thereby indicate that the designated key 82 is in a non-depressed or opened condition.

Unlike the known prior art devices, clamping the first data node 78 to the second reference potential through the high impedance of FET 70 substantially reduces the effects of circuit noise when multiple strobe driver FETs 51 are employed. An example of the noise which is eliminated by the instant circuit is that which is caused by the cumulative effect of the capacitance 63 inherently formed across the anode-cathode junction of display LEDs 62. Such circuit noise in the prior art circuits is known to make the first and second reference potentials received by a signal processor relatively indistinguishable relative to one another.

By virtue of the voltage level translator FET 68, the voltage of second data node 80 is independent of a voltage change of source voltage $-V_{LED}$. As the source voltage $-V_{LED}$ begins to diminish with time (e.g., from −9 v. to −5 v.) or as a segment select FET 52 is subsequently rendered conducting, the voltage of the first data node 78 will track the voltage change at common junction 64 when a key 82 is depressed. However, the voltage of the second data node 80 remains at its precharged level. This insures that the first and second reference potentials received by signal processor 84 are clearly distinguishable from one another. Moreover, a diminishing voltage at common junction 79 will not affect the voltage level of second data node 80.

It will be apparent that while a preferred embodiment of the invention has been shown and described, various modifications and changes may be made without departing from the true spirit and scope of the invention. For example, the field effect transistors herein disclosed may be n-channel as well as p-channel devices. Thus, the various numerical values associated with the signals which are applied to the field effect transistors and to the data nodes are for exemplary purposes only. It is to be understood, therefore, that either positive or negative logic may be utilized with signals of appropriate magnitude and polarity. Moreover, the instant circuit is not to be regarded as limited solely to utilization with calculator displays, but may be employed when it is desirable to efficiently drive both a keyboard and any associated display.

Having thus set forth a preferred embodiment of the instant invention, what is claimed is:

1. A circuit to indicate the condition of a switch means having a first and a second switch condition, said circuit including:

source means to provide a plurality of reference potentials;

data node means;

means to selectively precharge said data node means to a first level signal during a precharge interval of time;

means to discharge said data node means to a second signal level during an evaluation interval of time;

a multi-terminal semiconductor device having first and second condition path terminals and a control terminal;

said conduction path terminals selectively connected between said data node means and the means to discharge said data node means;

means to selectively connect said control terminal to said source means to receive a first of said plurality of reference potentials during said precharge interval of time to disable said multi-terminal device and thereby maintain said data node means at the first signal level;

means to selectively connect said control terminal to said source means to receive a second of said plurality of reference potentials during said evaluation interval of time to enable said multi-terminal device in order to discharge said data node means to said second signal level;

said switch means rendered conductive in said first switch condition to selectively connect one of the conduction path terminals of said multi-terminal device to said source means to receive the second of said reference potentials and thereby disable said multi-terminal device;

said switch means rendered non-conductive in said second switch condition in order to enable said multi-terminal device during said evaluation interval; and utilization means connected to said data node means and responsive to the signal level thereat during the evaluation interval of time so as to be indicative of the condition of said switch means.

2. The combination recited in claim 1, wherein said multi-terminal semiconductor device is a field effect transistor having gate, source and drain terminals corresponding to said control and said first and second conduction path terminals respectively.

3. The combination of claim 1, wherein said switch means is at least one single pole, single throw switch.

4. The circuit recited in claim 1, including at least one light emitting diode having respective first and second conduction path terminals and a field effect transistor to drive said light emitting diode having respective first and second conduction path terminals and a control terminal;

first conduction path terminals of said light emitting diode and said driver field effect transistor selectively connected together and to said one conduction path terminal of said multi-terminal semiconductor device via said switch means when said switch means is rendered conductive in said first condition; and the second conduction path terminal of said driver field effect transistor selectively connected to said source means to receive the second of said plurality of reference potentials.

5. The circuit recited in claim 4, wherein said light emitting diode comprises a display means.

6. The circuit recited in claim 4, wherein said means to discharge said data node to a second signal level is a high impedance field effect transistor, the impedance thereof being substantially greater than that of said driver field effect transistor.

7. The circuit recited in claim 4, including a selection field effect transistor having first and second conduction path terminals and a control terminal;

said selection field effect transistor connected between the second conduction path terminal of said light emitting diode and said source means to receive the first of said plurality of reference potentials and thereby selectively render said light emitting diode conductive.

8. The circuit recited in claim 7, wherein said driver field effect transistor, said selection field effect transistor and said high impedance field effect transistor are disposed upon a single semiconductor chip means.

9. The circuit recited in claim 8, including energization control means connected to each of the control terminals of said driver and selection field transistors; said energization control means adapted to selectively render said driver field effect transistor conductive and said selection field effect transistor non-conductive during said evaluation time interval.

10. The combination recited in claim 1, said means to precharge said data node and each of said means to selectively connect the control terminal of said multi-terminal semiconductor device to said source means including multi-phase clock signal generating means to synchronously control the charging of said data node means and the enabling of said multi-terminal device during said precharge and evaluation intervals of time.

11. In combination:

source means to provide a plurality of reference potentials;

data node means;

first and second multi-terminal semiconductor devices;

transmission gate means have conduction path terminals selectively connected between said data node means and a first of said multi-terminal semiconductor devices;

switch means having a first and a second switch condition;

said switch means rendered conductive in a first of said switch conditions and selectively connected between said source means and a point between a conduction path terminal of said transmission gate means and said first multi-terminal semiconductor device to disable said transmission gate means;

said switch means rendered non-conductive in the second of said switch conditions in order to enable said transmission gate means;

means connected to a control terminal of said transmission gate means to selectively enable said transmission gate means when said switch means is in said second switch condition;

said second multi-terminal semiconductor device having conduction path terminals selectively connected between said data node means and said source means in order to precharge said data node means to a first of said plurality of reference potentials when said switch means is in said first condition and said transmission gate means is disabled;

said first multi-terminal semiconductor device having conduction path terminals connected between said data node means and said source means to discharge said data node means to a second of said plurality of reference potentials when said switch means is in said second condition and said transmission gate means is enabled; and sensing means connected to said data node means and responsive to the potential thereof in order to provide an indication of the respective conditions of said switch means.

* * * * *